United States Patent [19]
Yin

[11] Patent Number: 5,517,148
[45] Date of Patent: May 14, 1996

[54] LOW CURRENT DIFFERENTIAL LEVEL SHIFTER

[75] Inventor: Rong Yin, Coppell, Tex.

[73] Assignee: SGS-Thomson Microelectronics, Inc., Carrollton, Tex.

[21] Appl. No.: 331,892

[22] Filed: Oct. 31, 1994

[51] Int. Cl.$^6$ ........................................... H03F 3/45
[52] U.S. Cl. ................... 327/333; 327/65; 327/563; 326/68; 330/253; 330/257; 330/261
[58] Field of Search ....................... 327/65, 52, 333, 327/563, 544, 545, 437; 330/253, 257, 261; 326/68, 81, 82

[56] References Cited

U.S. PATENT DOCUMENTS

| | | | |
|---|---|---|---|
| 4,495,429 | 1/1985 | Oda et al. | 330/257 |
| 4,604,533 | 8/1986 | Miyamoto et al. | 327/66 |
| 4,791,326 | 12/1988 | Uajdic et al. | 327/437 |
| 4,835,417 | 5/1989 | Kousaka et al. | 327/65 |
| 4,999,519 | 3/1991 | Kitsukawa et al. | 327/544 |
| 5,166,638 | 11/1992 | Koga | 330/261 |
| 5,362,995 | 11/1994 | Kubo | 327/65 |

Primary Examiner—John S. Heyman
Assistant Examiner—Terry L. Englund
Attorney, Agent, or Firm—Renee M. Larson; Lisa K. Jorgenson

[57] ABSTRACT

The low current level shifter stage of an oscillator circuitry having stable frequency response and low total current consumption over a wide range of supply voltage is comprised of a current switch, a differential to single ended converter (D/S), and at least one output stage. The low current level shifter is provided with differential input signals to improve the noise immunity such that stable frequency response over a wide range of supply voltage may be realized. The low current level shifter is current controlled such that low current consumption over a wide range of supply voltage may be realized. Specifically, the output stage of the low current level shifter has inverter circuitry which operates to lower the current consumption of the level shifter by not simultaneously turning on both NMOS and PMOS transistors of the output stages and by reducing the voltage levels within the output stages which must be switched.

19 Claims, 3 Drawing Sheets 5,517,148

LOW CURRENT DIFFERENTIAL LEVEL SHIFTER

CROSS REFERENCE TO RELATED APPLICATIONS

The subject matter of the present application is related to U.S. Pat. No. 5,469,116 issued Nov. 21, 1995, titled "Clock Generator Circuit with Low Current Frequency Divider", which is assigned to the assignee hereof and is herein incorporated by reference.

BACKGROUND OF THE INVENTION

The present invention relates generally to voltage level shifter circuitry, and more specifically to level shifter circuitry with low current.

Level shifter circuitry is utilized in a variety of applications typically to amplify an output signal to a desired voltage swing level. For instance, level shifter circuitry is often utilized as a stage in crystal oscillator circuitry to amplify and therefore convert a small sine-wave form signal to a fully swinged digital square wave form. Referring to FIG. 1, a prior art oscillator circuit having an Oscillator, a Voltage Regulator, an Amplifier/Level Shifter stage, and an Output stage which produces an Output signal is shown. The Oscillator, Voltage Regulator, and Output stage are provided with supply voltage Vcc; the Voltage Regulator provides the Amplifier/Level Shifter stage with supply voltage Vcc1, as shown. The Voltage Regulator is used to lower the power supply level of the Amplifier/Level Shifter stage such that the total current utilized by the oscillator circuit is reduced. The Output stage is used to get a fully swinged digital Output signal. The current in the Output stage is Vcc dependent. Thus, the use of a single Voltage Regulator element of the type shown in FIG. 1 may not be a good approach for lowering the current consumption of the oscillator circuitry over a wide range of supply voltage, such as Vcc.

Additionally, the oscillator circuitry of FIG. 1 presents a noise immunity problem. A single signal which is generated by the Oscillator is used as the input signal of the Amplifier/Level Shifter stage. Since the wave form generated by the Oscillator is normally a sine-wave form, it is very easy and common for noise from other parts of a system having the oscillator circuitry, through the common ground bus or substrate of the system, to interfere with the sine-wave form. This interference may manifest itself as a glitch which could accidentally trigger the Amplifier/Level Shifter stage, thereby causing unstable frequency response.

Thus, there exists an unmet need in the art to provide level shifter circuitry capable of stable frequency response and low current consumption over a wide range of supply voltage.

SUMMARY OF THE INVENTION

It would be advantageous in the art for level shifter circuitry to have stable frequency response over a wide range of supply voltage.

It would further be advantageous in the art for level shifter circuitry to have low current consumption over a wide range of supply voltage.

Therefore, according to the present invention, a low current level shifter stage suitable for use in oscillator or other circuitry having stable frequency response and low total current consumption over a wide range of supply voltage is disclosed. The low current level shifter is comprised of a current switch, a differential to single ended converter (D/S), and at least one output stage. The low current level shifter is provided with differential input signals to improve the noise immunity such that stable frequency response over a wide range of supply voltage may be realized. The low current level shifter is current controlled such that low current consumption over a wide range of supply voltage may be realized.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Figure 1:
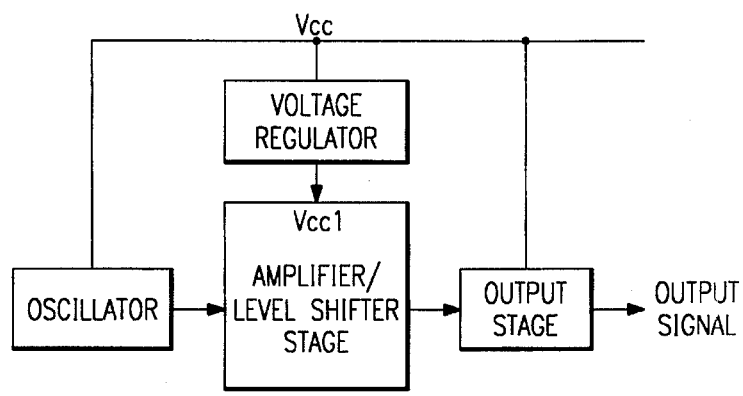
FIG. 1 is a block diagram of oscillator circuitry, according to the prior art.
Figure 2:
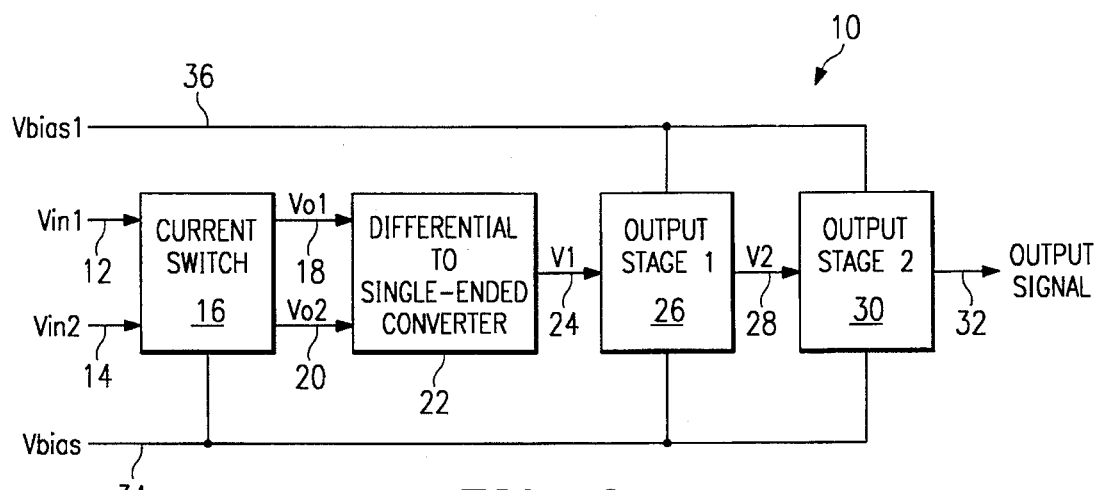
FIG. 2 is a block diagram of a level shifter stage according to the present invention.

Referring to FIG. 2, a block diagram of a level shifter suitable for use in oscillator circuitry or other circuitry where it is desired to amplify an output signal to a desired voltage swing level, according to the present invention, is shown. The low current level shifter differs from the prior art level shifter in that it is supplied with a differential voltage input signal pair, Vin1 12 and Vin2 14, rather than just a single input signal. The low current level shifter 10 is comprised of a Current Switch (CS) 16, a Differential to Single ended converter (D/S) 22, and two output stages: Output Stage 1 26 and Output Stage2 30. These elements of the low current level shifter stage operate to generate the Output signal 32. Current Switch 16 is controlled by voltage reference Vbias signal 34 to generate differential voltage signal pair: Vo1 signal 18 and Vo2 signal 20 which are in turn input signals to D/S 22. D/S 22 takes Vo1 signal 18 and Vo2 signal 20 and generates a single signal V1 24 which is an input signal to Output Stage1 26 as shown. Output Stage1 26 and Output Stage2 30 are controlled by voltage reference signals Vbias and Vbias1 signals 34 and 36, respectively, as shown. Output Stage1 26 is provided with signal V1 24 and generates signal V2 28; Signal V2 28 is an input signal to Output Stage2 30 which generates Output signal 32.

Figure 3:
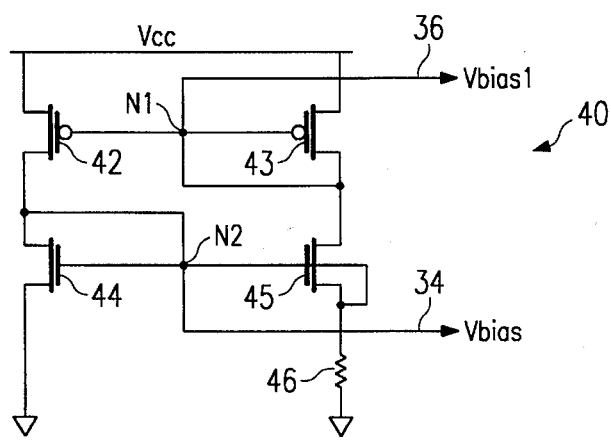
FIG. 3 is a schematic diagram of the current source which supplies the signals Vbias and Vbias1 as shown in the block diagram of FIG. 2, according to the present invention.

Vbias signal 34 and Vbias1 signal 36 are generated by current source circuitry 40 shown in FIG. 3. Current source circuitry 40 is comprised of PMOS p-channel transistors 42 and 43, NMOS n-channel transistors 44 and 45, resistor 46, and supply voltage Vcc. As shown in FIG. 3, these elements are electrically connected in the following manner: A first source/drain of transistors 42 and 43 are electrically connected to supply voltage Vcc. Vbias1 signal 36 is represented by a node N1 which is formed by the electrical connection of the gate of transistor 42, the gate of transistor 43, a second source/drain of transistor 43, and a first source/drain of transistor 45. A second source/drain of transistor 42 is electrically connected to a first source/drain of transistor 44, the gates of transistors 44 and 45, and a second source/drain of transistor 45 to form a node N2 representative of Vbias signal 34; a second source/drain of transistor 44 is electrically connected to ground potential. The second source/drain of transistor 45 is electrically connected to resistor 46 which is in turn connected to ground potential.

Figure 4:
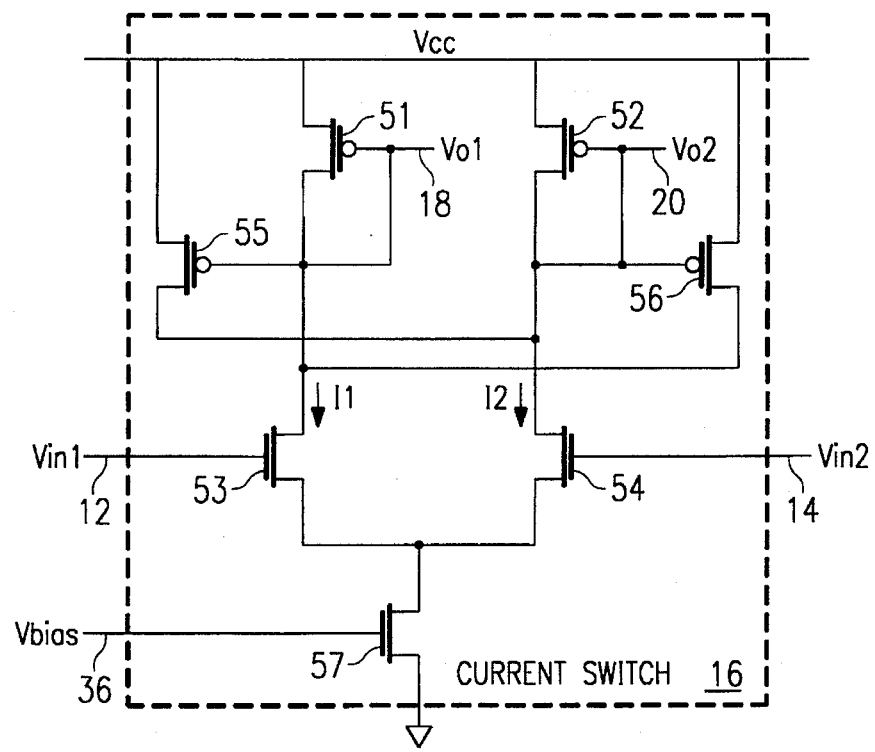
FIG. 4 is a schematic diagram of the current switch shown in the block diagram of FIG. 2, according to the present invention.

Referring to FIG. 4, a schematic diagram of the current switch 16 of FIG. 2, according to the present invention, is shown. Current switch 16 is provided with differential voltage input signal pair, Vin1 12 and Vin2 14, and has the following elements: p-channel transistors 51, 52, 55, and 56, and n-channel transistors 53, 54, and 57. Differential voltage input signal pair Vin1 12 and Vin2 14 are provided to the gate of transistors 53 and 54, respectively; Vbias signal 36 is provided to the gate of transistor 57. The elements of current switch 16 are electrically connected as follows: A first source/drain of transistors 51, 52, 55, and 56 are connected to supply voltage Vcc. Differential voltage signal 18 at node Vo1 is represented by the electrical connection of the gate of transistor 51, a second source/drain of transistor 51, the gate of transistor 55, a first source/drain of transistor 53, and a second source/drain of transistor 56. Differential voltage signal 20 at node Vo2 is represented by the electrical connection of the gate of transistor 52, a second source/drain of transistor 52, a gate of transistor 56, a second source/drain of transistor 55, and a first source/drain of transistor 54. A second source/drain of transistor 53 and a second source/drain of transistor 54 are electrically connected to a first source/drain of transistor 57. A second source/drain of transistor 57 is connected to ground potential.

Each of the transistors 51, 52, 53, 54, 55, 56, and 57 are operating in a weak inversion range. Transistor 57 controls the current of this current switch stage. When Vin1 signal 12 increases and Vin2 signal 14 decreases, I1, the current through transistor 53, increases and node Vo1 is pulled down towards Vcc - Vtp, where Vtp represents the threshold voltage of transistor 51; meanwhile, the increased current in transistor 55 helps transistor 52 pull node Vo2 to supply voltage Vcc. On the other hand, when Vin1 signal 12 decreases and Vin2 signal 14 increases, I2, the current through transistor 54 increases and node Vo2 is pulled down towards Vcc - Vtp, where Vtp represents the threshold voltage of transistor 52; meanwhile, the increased current in transistor 56 helps transistor 51 pull node Vo1 to supply voltage Vcc. Even when current I is representative of a small bias current, less than 30 nA, for instance, the differential gain represented by VO1/(Vin1-Vin2) can be higher than 10. Thus, according to the present invention, two differential input signals Vin1 12 and Vin2 14 with small voltage swing and 180° phase shift can be converted to two non-overlapped quasi-square wave forms with 180° phase shift at nodes Vo1 and Vo2. The low voltage level of nodes Vo1 and Vo2 is approximately equal to Vcc-Vtp; the high voltage level of nodes Vo1 and Vo2 is approximately equal to Vcc.

Figure 5:
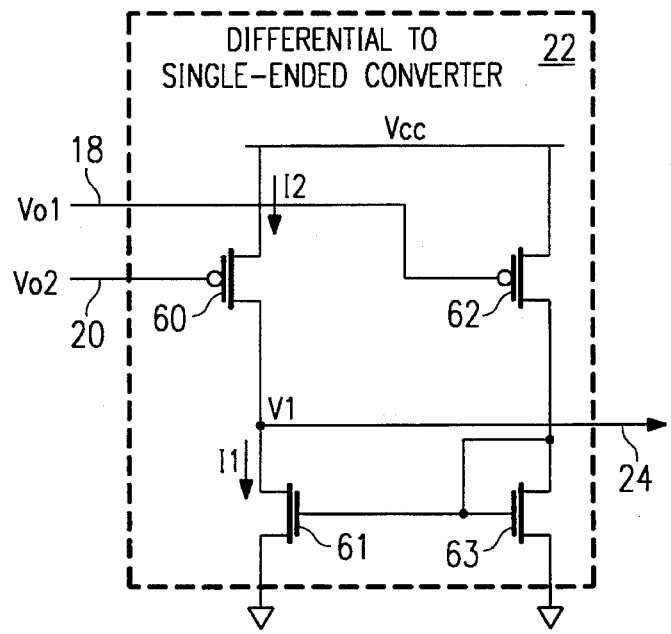
FIG. 5 is a schematic diagram of the differential to single ended converter (D/S) shown in the block diagram of FIG. 2, according to the present invention.

Referring to FIG. 5, a schematic diagram of the differential to single ended converter (D/S) 22 of FIG. 2 is shown. D/S circuitry 22 is comprised of p-channel transistors 60 and 62, and n-channel transistors 61 and 63. D/S circuitry 22 is supplied with differential voltage signal pair Vo1 18 and Vo2 20 through the gate of transistor 62 and the gate of transistor 60, respectively. A first source/drain of transistor 60 and a first source/drain of transistor 62 are connected to supply voltage Vcc. A second source/drain of transistor 60 is electrically connected to a first source/drain of transistor 61, and a second source/drain of transistor 62 is electrically connected to a first source/drain of transistor 63 and the gates of transistors 61 and 63. A second source/drain of transistor 61 and a second source/drain of transistor 63 are electrically connected to ground potential, as shown. Output signal 24 is represented by node V1 which is defined as the electrical connection of the second source/drain of transistor 60 and the first source/drain of transistor 61.

The Differential to Single ended converter 22 performs a level shifter and gain stage function for low current level shifter 10 of FIG. 2. Since differential voltage signal pair Vo1 18 and Vo2 20 are non-overlapped signals, when Vo1 18 is ON and Vo2 20 is OFF, mirrored current I1 through transistor 61 pulls node V1 to ground potential. On the other hand, when Vo1 is OFF and Vo2 20 is ON, current I2 through transistor 60 works to pull node V1 up to supply voltage Vcc. The rising/falling edge of output signal 24 at node V1 is determined by current I1 or I2 and the node capacitance at node V1. Current I1 is designed to be equal to current I2. Usually, the rising/falling edge at node V1 is slow due to small current limitations. Thus, in order to get a sufficiently fast transient output signal with low current, Output Stage1 26 and Output Stage2 30 are added to D/S converter 22, as shown in FIG. 2.

Figure 6:
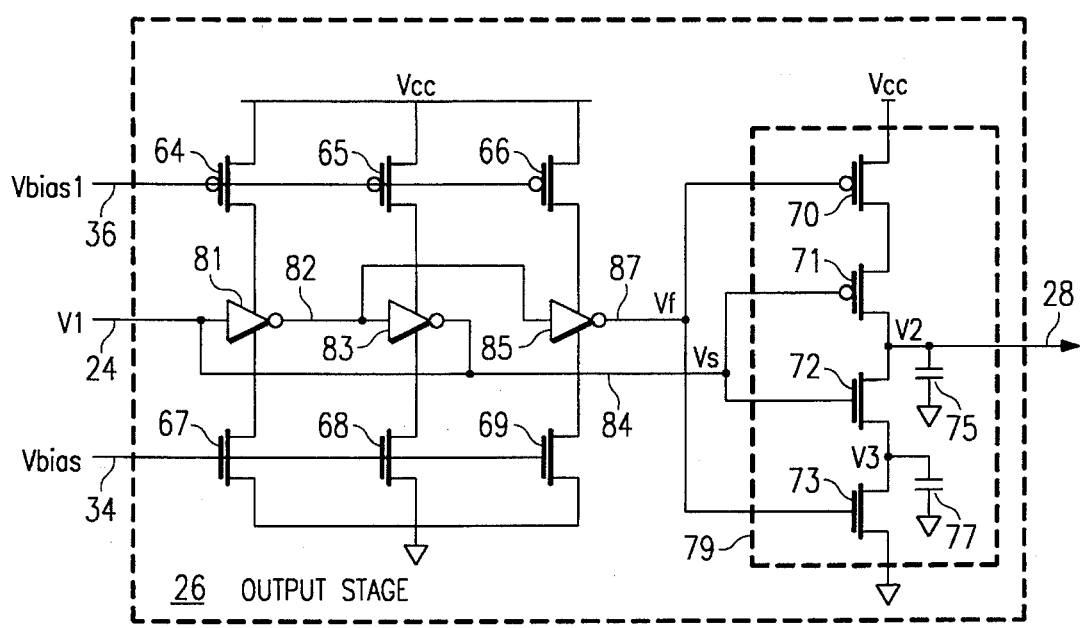
FIG. 6 is a schematic diagram of an output stage shown in the block diagram of FIG. 2, according to the present invention.

Referring to FIG. 6, a schematic diagram of an output stage 26, representative of both Output Stage1 26 and Output Stage 30 of FIG. 2, is shown. The output stages are utilized to obtain a sufficiently fast transient output signal with low current. In keeping with the block diagram of FIG. 2, two output stages of the type shown in FIG. 6 are connected together in series to approximate the output stages 26 and 30 shown in FIG. 2. While two output stages are shown in FIGS. 2 and 6, it is important to recognize that the present invention need only utilize only one output stage. The use of two output stages 26 and 30 result in a faster transient output signal with low current then if just one output stage were used.

Output stage 26 is comprised of the following elements: transistors 64, 65, 66, 67, 68, 69, 70, 71, 72, and 73, capacitors 75 and 77, and inverters 81, 83, and 85. As shown in FIGS. 2 and 6, output stage 26 is provided with voltage reference signals Vbias signal 34 and Vbias1 signal 36, V1 signal 24 from Differential to Single ended converter 22, and produces output signal 28 at node V2. Voltage reference signals Vbias signal 34 and Vbias1 signal 36 bias inverters 81, 83, and 85 by limiting the current of inverters 81, 83, and 85 such that a relatively fast signal 87 at node Vf and a relatively slow signal 84 node Vs are produced.

The elements of output stage 26 are electrically connected in the following manner. Vbias1 signal 36 is supplied to the gates of transistors 64, 65, 66; Vbias signal 34 is supplied to the gates of transistors 67, 68, 69; V1 signal 24 is supplied to inverter 81. The output signal 82 of inverter 81 is supplied to inverters 83 and 85. The output signal of inverter 83 is slow signal 84. Slow node Vs is defined as the electrical connection of slow signal 84, the gate of transistor 71, and the gate of transistor 72. The fast output signal 87 of inverter 85, together with the gate of transistor 70 and the gate of transistor 73, define fast node Vf. As shown in the timing diagram of FIG. 7, fast signal 87 is delayed with respect to slow signal 84.

Figure 7:
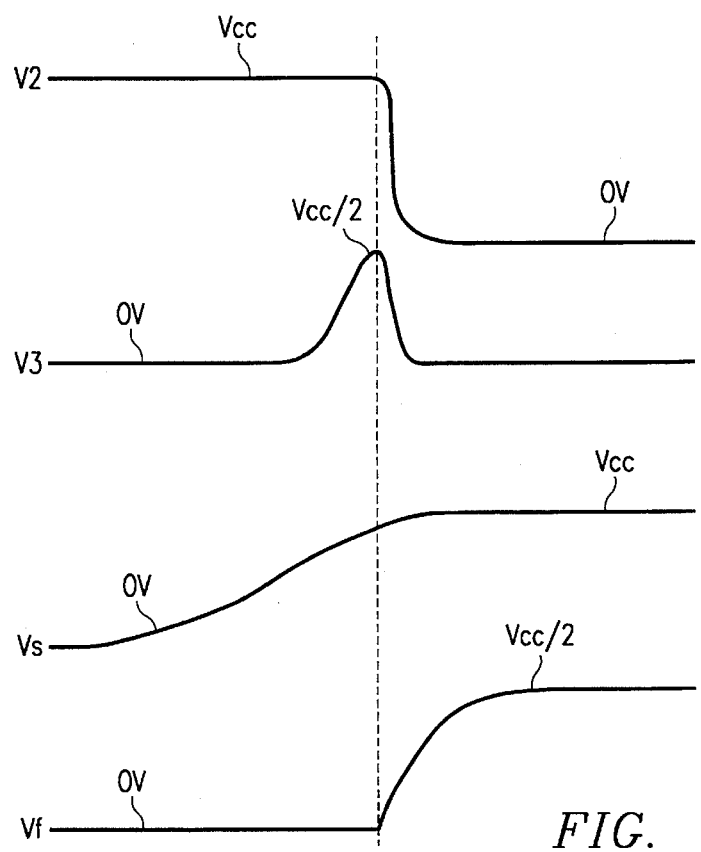
FIG. 7 is a timing diagram, according to the present invention.

The feedback loop from the output signal 84 of inverter 83 to the input signal 24 of inverter 81 operates to improve input signal 24 by making input signal 24 at node V1 equal to slow signal 84 at slow node Vs. Transistors 70, 71, 72, and 73 and parasitic node capacitance's denoted at capacitor 75 at node V2 and capacitor 77 at node V3 form an inverter stage 79. Since fast signal 87 at node Vf is delayed with respect to slow signal 84 at node Vs, as shown in FIG. 7, transistor 72 turns on before transistor 73 and the intermediate voltage at node V3 rises quickly because of charge sharing between capacitors 75 and 77. Additionally, the drain to source voltage Vds of transistor 72 is quickly reduced. When fast signal 87 at node Vf does come on by going to a Vcc logic level, both transistors 72 and 73 of inverter stage 79 turn on and the drain to source voltage of transistors 72 and 73 drops from a Vcc/2 logic level to a logic level equal to ground potential.

An important advantage provided by the inverter stage 79 of FIG. 6 is that the current of output stage 26 is greatly reduced by virtue of not simultaneously turning on PMOS transistors 70 and 71 and NMOS transistors 72 and 73 for a long period of time. Additionally, current switching transients are reduced by switching a node having only half the voltage of the prior art: i.e. Vcc/2 rather than Vcc.

The circuitries and timing diagram of FIGS. 2 to 7 illustrate a differential low current level shifter which is provided with differential input signals and which provides the advantages of stable frequency response and low total current consumption over a wide range of supply voltage. As discussed above, the low current level shifter of the present invention is comprised of a current switch, a differential to single ended converter (D/S), and two output stages. Providing the low current level shifter with differential input signals improves the noise immunity such that stable frequency response over a wide range of supply voltage may be realized.

Additionally, the low current level shifter is current controlled such that low current consumption over a wide range of supply voltage may be realized. Specifically, the output stages of the low current level shifter have inverter circuitry which operates to lower the current consumption of the level shifter by not simultaneously turning on both NMOS and PMOS transistors of the output stages and by reducing the voltage levels within the output stages which must be switched.

While the invention has been particularly shown and described with reference to a preferred embodiment, it will be understood by those skilled in the art that various changes in form and detail may be made therein without departing from the spirit and scope of the invention. For instance, one skilled in the art will recognize that the n-channel NMOS and p-channel PMOS transistors may be changed to the opposite type with appropriate changes to the supply voltage of the transistors. Additionally, one skilled in the art will recognize that while two output stages have been shown, the invention may be utilized with only one output stage without departing from the spirit and scope of the invention.

What is claimed is:

1. A low current differential level shifter capable of stable frequency response and low current consumption over a wide range of supply voltage, comprising:

a current switch which is controlled by a first voltage reference signal to generate a second differential voltage signal pair given a first differential voltage signal pair as input signals wherein providing the current switch with the first differential voltage signal pair improves noise immunity of the level shifter, thereby ensuring stable frequency response of the level shifter over a wide range of a supply voltage;

a differential to single ended converter of the level shifter, having the second differential voltage signal pair as input signals, which performs a level shifter and gain function and which generates an output signal; and an output stage of the level shifter, having the output signal of the differential to single ended converter as an input signal, which generates a first level shifter output signal wherein the output stage is controlled by the first voltage reference signal and a second voltage reference signal.

2. The low current differential level shifter of claim 1, further comprising:

a second output stage of the level shifter which generates a second level shifter output signal having low current given the first level shifter output signal as an input signal wherein the second output stage is controlled by the first voltage reference signal and the second voltage reference signal.

3. The low current level shifter of claim 1, wherein the differential to single ended converter comprises:

a first MOS transistor having a gate, a first source/drain, and a second source/drain wherein the gate of the first MOS transistor is supplied with a first signal of the second differential voltage signal pair and the first source/drain of the first MOS transistor is electrically connected to the supply voltage;

a second MOS transistor having a gate, a first source/drain, and a second source/drain wherein the gate of the second MOS transistor is supplied with a second signal of the second differential voltage signal pair and the first source/drain of the second MOS transistor is electrically connected to the supply voltage;

a third MOS transistor having a gate, a first source/drain, and a second source/drain wherein the first source/drain of the third MOS transistor and the second source/drain of the first MOS transistor are electrically connected thereby defining the output signal of the differential to single ended converter; and wherein the second source/drain of the third MOS transistor is electrically connected to a ground potential; and a fourth MOS transistor having a gate, a first source/drain, and a second source/drain wherein the first source/drain of the fourth MOS transistor is electrically connected to the second source/drain of the second MOS transistor, the gate of the third MOS transistor, and the gate of the fourth MOS transistor; and wherein the second source/drain of the fourth MOS transistor is electrically connected to the ground potential.

4. The low current level shifter of claim 3, wherein when the first signal of the second differential voltage signal pair is OFF and the second signal of the second differential voltage signal pair is ON, a first current through the third MOS transistor pulls the output signal of the differential to single ended converter towards the ground potential.

5. The low current level shifter of claim 3, wherein when the first signal of the second differential voltage signal pair is ON and the second signal of the second differential voltage signal pair is OFF, a second current through the first MOS transistor pulls the output signal of the differential to single ended converter towards the supply voltage.

6. A low current differential level shifter capable of stable frequency response and low current consumption over a wide range of supply voltage, comprising:

a current switch which is controlled by a first voltage reference signal to generate a second differential voltage signal pair given a first differential voltage signal pair as input signals wherein providing the current switch with the first differential voltage signal pair improves noise immunity of the level shifter, thereby ensuring stable frequency response of the level shifter over a wide range of a supply voltage;

a differential to single ended converter of the level shifter, having the second differential voltage signal pair as input signals, which performs a level shifter and gain function and which generates an output signal; and an output stage of the level shifter, having the output signal of the differential to single ended converter as an input signal, which generates a level shifter output signal wherein the output stage is controlled by the first voltage reference signal and a second voltage reference signal;

wherein the first voltage reference signal and the second voltage reference signal are generated by a current source circuitry which comprises:

a first MOS transistor having a first source/drain, a second source/drain, and a gate wherein the first source/drain of the first MOS transistor is electrically connected to the supply voltage;

a second MOS transistor having a first source/drain, a second source/drain, and a gate wherein the first source/drain of the second MOS transistor is electrically connected to the supply voltage, the gate of the second MOS transistor is electrically connected to the gate of the first MOS transistor;

a third MOS transistor having a first source/drain, a second source/drain, and a gate wherein the first source/drain of the third MOS transistor is electrically connected to the second source/drain of the first MOS transistor and the gate of the third MOS transistor; and a fourth MOS transistor having a first source/drain, a second source/drain, and a gate wherein the first source/drain of the fourth MOS transistor is electrically connected to the second source/drain of the second MOS transistor and the gates of the first MOS transistor and the second MOS transistor thereby defining a first node representative of the second voltage reference signal;

and wherein the second source/drain of the fourth MOS transistor is electrically connected to the gate of the fourth MOS transistor, the gate of the third MOS transistor, the first source/drain of the third MOS transistor, and the second source/drain of the first MOS transistor thereby defining a second node representative of the first voltage reference signal.

7. A low current differential level shifter capable of stable frequency response and low current consumption over a wide range of supply voltage, comprising:

a current switch which is controlled by a first voltage reference signal to generate a second differential voltage signal pair given a first differential voltage signal pair as input signals wherein providing the current switch with the first differential voltage signal pair improves noise immunity of the level shifter, thereby ensuring stable frequency response of the level shifter over a wide range of a supply voltage;

a differential to single ended converter of the level shifter, having the second differential voltage signal pair as input signals, which performs a level shifter and gain function and which generates an output signal; and an output stage of the level shifter, having the output signal of the differential to single ended converter as an input signal, which generates a level shifter output signal wherein the output stage is controlled by the first voltage reference signal and a second voltage reference signal;

wherein the current switch comprises:

a first MOS transistor having a gate, a first source/drain, and a second source/drain; a second MOS transistor having a gate, a first source/drain, and a second source/drain; a third MOS transistor having a gate, a first source/drain, and a second source/drain; and a fourth MOS transistor having a gate, a first source/drain, and a second source/drain;

a fifth MOS transistor having a gate, a first source/drain, and a second source/drain; a sixth MOS transistor having a gate, a first source/drain, and a second source/drain; a seventh MOS transistor having a gate, a first source/drain, and a second source/drain;

wherein the first differential voltage signal pair is provided to the gates of the fifth MOS transistor and the sixth MOS transistor, respectively; the first reference voltage signal is provided to the gate of the seventh MOS transistor; wherein a first source/drain of the first MOS transistor, a first source/drain of the second MOS transistor, a first source/drain of the third MOS transistor, and a first source/drain of the fourth MOS transistor are electrically connected to the supply voltage;

wherein a first signal of the second differential voltage signal pair is represented by a first node defined as the electrical connection of the gate of the first MOS transistor, the second source/drain of the second MOS transistor, the gate of the second MOS transistor, the first source/drain of the fifth MOS transistor, and the second source/drain of the fourth MOS transistor;

wherein a second signal of the second differential voltage signal pair is represented by a second node defined as the electrical connection of the gate of the third MOS transistor, the second source/drain of the third MOS transistor, the gate of the fourth MOS transistor, the second source/drain of the first MOS transistor, and the first source/drain of the sixth MOS transistor; and wherein the second source/drain of the fifth MOS transistor is electrically connected to the second source/drain of the sixth MOS transistor and the first source/drain of the seventh MOS transistor; wherein the second source/drain of the seventh MOS transistor is electrically connected to a ground potential.

8. The low current level shifter of claim 7, wherein the first MOS transistor, the second MOS transistor, the third MOS transistor, the fourth MOS transistor, the fifth MOS transistor, the sixth MOS transistor, and the seventh MOS transistor of the current switch are weak inversion transistors.

9. The low current level shifter of claim 8, wherein as the first signal of the first differential voltage signal pair increases and the second signal of the first differential voltage signal pair decreases, a current through the fifth MOS transistor increases and the first node is pulled towards a Vcc-Vtp potential, and a current through the first MOS transistor increases and pulls the second node towards the supply voltage, wherein Vcc is the supply voltage and Vtp is a threshold voltage of the second MOS transistor.

10. The low current level shifter of claim 8, wherein as the first signal of the first differential voltage signal pair decreases and the second signal of the first differential voltage signal pair increases, a current through the sixth MOS transistor increases and the second node is pulled towards a Vcc,-Vtp potential, and a current through the fourth MOS transistor increases and pulls the first node towards the supply voltage, wherein Vcc is the supply voltage and Vtp is a threshold voltage of the third MOS transistor.

11. A low current differential level shifter capable of stable frequency response and low current consumption over a wide range of supply voltage, comprising:

a current switch which is controlled by a first voltage reference signal to generate a second differential voltage signal pair given a first differential voltage signal pair as input signals wherein providing the current switch with the first differential voltage signal pair improves noise immunity of the level shifter, thereby ensuring stable frequency response of the level shifter over a wide range of a supply voltage;

a differential to single ended converter of the level shifter, having the second differential voltage signal pair as input signals, which performs a level shifter and gain function and which generates an output signal; and an output stage of the level shifter, having the output signal of the differential to single ended converter as an input signal, which generates a level shifter output signal wherein the output stage is controlled by the first voltage reference signal and a second voltage reference signal;

wherein the output stage comprises:

a first MOS transistor, a second MOS transistor, a third MOS transistor, a fourth MOS transistor, and a fifth MOS transistor, with each MOS transistor having a gate, a first source/drain, and a second source/drain; wherein the first source/drains of the first MOS transistor, the second MOS transistor, the third MOS transistor and the fourth MOS transistor are electrically connected to the supply voltage; the gates of the first MOS transistor, the second MOS transistor, and the third MOS transistor are supplied with the second voltage reference signal; and the second source/drain of the fourth MOS transistor is electrically connected to the first source/drain of the fifth MOS transistor;

a sixth MOS transistor, a seventh MOS transistor, a eighth MOS transistor, a ninth MOS transistor, and a tenth MOS transistor, with each MOS transistor having a gate, a first source/drain, and a second source/drain; wherein the second source/drains of the sixth MOS transistor, the seventh MOS transistor, the eighth MOS transistor and the tenth MOS transistor are electrically connected to a ground potential; the gates of the sixth MOS transistor, the seventh MOS transistor, and the eighth MOS transistor are supplied with the first voltage reference signal;

a first inverter, a second inverter, and a third inverter; wherein the first inverter is supplied with the output signal of the differential to single ended converter as an input signal, the second inverter and the third inverter are supplied with an output signal of the first inverter; the first inverter is connected to the second source/drain of the first MOS transistor and the first source/drain of the sixth MOS transistor; the second inverter is connected to the second source/drain of the second MOS transistor and the first source/drain of the seventh MOS transistor; the third inverter is connected to the second source/drain of the third MOS transistor and the first source/drain of the eighth MOS transistor;

wherein a first node representative of an output signal of the third inverter is defined as the electrical connection of the third inverter, the gate of the fourth MOS transistor, and the gate of the tenth MOS transistor;

wherein a second node representative of an output signal of the second inverter is defined as the electrical connection of the second inverter, the gate of the fifth MOS transistor, and the gate of the ninth MOS transistor;

wherein a third node representative of the level shifter output signal of the output stage is defined as the electrical connection of the second source/drain of the fifth MOS transistor, the first source/drain of the ninth MOS transistor, and a first capacitor; and wherein a fourth node is defined as the electrical connection of the second source/drain of the ninth MOS transistor, the first source/drain of the tenth MOS transistor, and a second capacitor.

12. The low current level shifter of claim 11, wherein a feedback loop from the output signal of the second inverter to the input signal of the first inverter improves the input signal of the first inverter by making the input signal of the first inverter equal to the output signal of the second inverter.

13. The low current level shifter of claim 11, wherein the first reference voltage signal and the second reference voltage signal bias the first inverter, the second inverter, and the third inverter by limiting a first current through the first inverter, a second current through the second inverter, and a third current through the third inverter such that the output signal of the third inverter is faster than the output signal of the second inverter.

14. The low current level shifter of claim 13, wherein the first capacitor, the second capacitor, the fourth MOS transistor, the fifth MOS transistor, the ninth MOS transistor, and the tenth MOS transistor form an inverter stage of the output stage.

15. The low current level shifter of claim 14, wherein since the output signal of the third inverter is relatively fast compared to the output signal of the second inverter, the ninth MOS transistor turns on before the tenth MOS transistor and a voltage at the fourth node rises quickly due to a charge sharing condition between the first capacitor and the second capacitor and a drain to source voltage of the ninth MOS transistor is quickly reduced.

16. The low current level shifter of claim 15, wherein when the output signal of the third inverter does go to a voltage level equal to the supply voltage, the ninth MOS transistor and the tenth MOS transistor turn ON and the drain to source voltage of the ninth MOS transistor and a drain to source voltage of the tenth MOS transistor drops from the voltage level equal to the supply voltage to a voltage level equal to half the supply voltage.

17. The low current level shifter of claim 16, wherein the inverter stage operates to lower a current consumption of the level shifter by not simultaneously turning on the fourth MOS transistor and the fifth MOS transistor, or by not simultaneously turning on the ninth MOS transistor and the tenth MOS transistor.

18. The low current level shifter of claim 16, wherein the inverter stage operates to lower a current consumption of the level shifter by reducing the drain to source voltage of the ninth MOS transistor and the drain to source voltage of the tenth MOS transistor which must be switched from the voltage level equal to the supply voltage to a voltage level equal to half the supply voltage.

19. The low current level shifter of claim 18, wherein reducing the drain to source voltage of the ninth MOS transistor and the drain to source voltage of the tenth MOS transistor reduces a current switching transient of the level shifter.

* * * * *